(12) United States Patent
Takahashi et al.

(10) Patent No.: US 11,300,621 B2
(45) Date of Patent: Apr. 12, 2022

(54) BATTERY LIFE LEARNING DEVICE, BATTERY LIFE PREDICTION DEVICE, METHOD AND NON-TRANSITORY COMPUTER READABLE MEDIUM

(71) Applicant: TOYOTA JIDOSHA KABUSHIKI KAISHA, Toyota (JP)

(72) Inventors: Ryosuke Takahashi, Toyota (JP); Norimitsu Tsutsui, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 85 days.

(21) Appl. No.: 16/778,353

(22) Filed: Jan. 31, 2020

(65) Prior Publication Data
US 2020/0292620 A1 Sep. 17, 2020

(30) Foreign Application Priority Data
Mar. 12, 2019 (JP) .............................. JP2019-045250

(51) Int. Cl.
*G01R 31/367* (2019.01)
*G01R 31/36* (2020.01)
*G01R 31/392* (2019.01)
*B60L 58/16* (2019.01)

(52) U.S. Cl.
CPC ............ *G01R 31/367* (2019.01); *B60L 58/16* (2019.02); *G01R 31/3648* (2013.01); *G01R 31/392* (2019.01)

(58) Field of Classification Search
CPC ................ G01R 31/367; G01R 31/392; G01R 31/3648; B60L 58/16
See application file for complete search history.

(56) References Cited

U.S. PATENT DOCUMENTS

| 2011/0191278 | A1 | 8/2011 | Song et al. | |
| 2013/0268466 | A1* | 10/2013 | Baek | G01R 31/392 706/12 |
| 2016/0161567 | A1* | 6/2016 | Park | G01R 31/3648 702/63 |
| 2016/0349330 | A1 | 12/2016 | Barfield, Jr. et al. | |
| 2018/0095140 | A1 | 4/2018 | Park et al. | |
| 2020/0088796 | A1* | 3/2020 | Werner | H02J 7/005 |

FOREIGN PATENT DOCUMENTS

| EP | 2648011 A1 | 10/2013 |
| EP | 3351953 A1 | 7/2018 |
| JP | 2018-179733 A | 11/2018 |

* cited by examiner

*Primary Examiner* — Manuel L Barbee
(74) *Attorney, Agent, or Firm* — Oliff PLC

(57) ABSTRACT

A battery life learning device including a learning section configured to obtain a learned prediction model for predicting a remaining life of a vehicle battery from time-series data of a deterioration characteristic of the vehicle battery, the learned prediction model being obtained by learning a prediction model from the time-series data of the deterioration characteristic of the vehicle battery based on learning data, the learning data including time-series data of the deterioration characteristic at a predetermined time point in the past of a vehicle battery for learning that has reached an end of life and the remaining life at the predetermined time point of the vehicle battery for learning.

15 Claims, 11 Drawing Sheets

FIG.9

| 2. Increase in Internal Resistance of Auxiliary Battery (1) ||||
|---|---|---|---|
| Graph Massage | Life of Auxiliary Battery may end within One Month |||
| Explanation of Graph | Graph Indicating Internal Resistance of Battery |||
| Recommended Product | Fig || Comments |
| Battery | increases as time elapses || [Aging deterioration tendency / Temporal over discharge]<br><br>The battery may be deteriorated due to aging or temporal over discharge. The vehicle may be used in low frequency or short distances. Please propose to check the battery by checking the graph indicating mileage and driving time for each use or graph indicating the dates of use. Please propose to replace the battery since there is a high possibility of the battery being deteriorated when "not good" is indicated in high accuracy deterioration determination, even when a good result has been achieved by the battery checker. |
| do not recommend | indicates high abnormal value | then returns to a normal value | [incorrect determination case]<br><br>Deterioration determination is incorrect due to abnormal value in internal resistance. Since there is a low possibility of battery deterioration, please do not propose battery check and reset the deterioration determination manually. |
| | indicates low abnormal value | then returns to a normal value | |

| 3. Increase in Internal Resistance of Auxiliary Battery (2) ||
| --- | --- |
| Graph Massage | No Feature |
| Explanation of Graph | Graph Indicating Internal Resistance of Battery |
| Recommended Product | Fig | Comments |
| Battery | 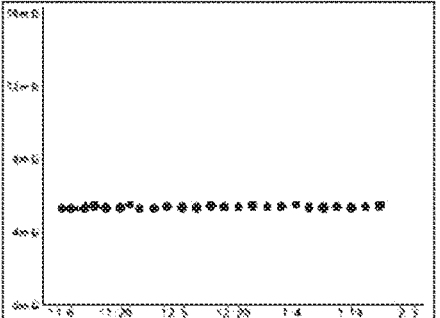 | No concern in internal resistance of auxiliary battery. However, sudden run out of battery may occur in the way of use. Please advise to check the battery frequently. |
| | 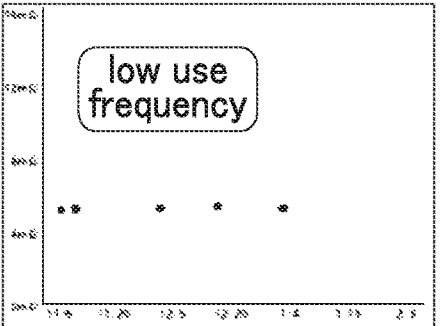 low use frequency | The discharge of the battery may progress and the battery may end its life due to low use frequency. Please advise to use the vehicle more. |

76B

BATTERY LIFE LEARNING DEVICE, BATTERY LIFE PREDICTION DEVICE, METHOD AND NON-TRANSITORY COMPUTER READABLE MEDIUM

CROSS-REFERENCE TO RELATED APPLICATION

This application claims priority under 35 USC 119 from Japanese Patent Application No. 2019-045250, filed Mar. 12, 2019, the disclosure of which is incorporated by reference herein.

BACKGROUND

Technical Field

The present disclosure relates to a battery life learning device, a battery life learning method, a non-transitory computer readable medium storing a battery life learning program, a battery life prediction device, a battery life prediction method, and a non-transitory computer readable medium storing a battery life prediction program.

Related Art

The technique described in Japanese Patent Application Laid-Open (JP-A) No. 2018-179733 obtains a time change in a deterioration characteristics from a measured value of a battery usage time and deterioration characteristics (for example, internal resistance) measured for each time, and based on the amount of change of the deterioration characteristic, a prediction function is selected from any one of a linear expression, a quadratic expression, an exponential function, etc. for each battery. Then, a predicted value of the deterioration characteristic is obtained based on the prediction function of the deterioration characteristic, and the battery life is diagnosed based on the predicted value of the deterioration characteristic.

However, since the amount of charge of a vehicle battery mounted on the vehicle changes depending on the usage of the vehicle, the deterioration characteristics such as internal resistance may temporarily change greatly. For example, when the vehicle is parked for a long time, over discharge occurs, the charge amount of the vehicle battery decreases, and the internal resistance of the vehicle battery temporarily increases, as shown in FIG. 11 as an example. In the technique described in JP-A No. 2018-179733, since the prediction function is switched when the deterioration characteristic such as the internal resistance of the vehicle battery temporarily changes, the prediction value of the vehicle battery life may fluctuate greatly.

SUMMARY

The present disclosure provides a battery life learning device, a battery life learning method, a non-transitory computer readable medium storing a battery life learning program, a battery life prediction device, a battery life prediction method, and a non-transitory computer readable medium storing a battery life prediction program that may improve the prediction accuracy when predicting the remaining life of a vehicle battery.

A first aspect of the present disclosure is a battery life learning device, including: a learning section configured to obtain a learned prediction model for predicting a remaining life of a vehicle battery from time-series data of a deterioration characteristic of the vehicle battery, the learned prediction model being obtained by learning a prediction model from the time-series data of the deterioration characteristic of the vehicle battery based on learning data, the learning data including time-series data of the deterioration characteristic at a predetermined time point in the past of a vehicle battery for learning that has reached an end of life and the remaining life at the predetermined time point of the vehicle battery for learning.

There is a possibility that the time-series data of the deterioration characteristic of the learning vehicle battery that has reached the end of life may include data that indicates a temporary change in the deterioration characteristic of the vehicle battery for learning. By performing learning using the learning data including the time-series data of the deterioration characteristic of the vehicle battery for learning as described above, the prediction model is learned so as to suppress erroneous prediction that there is no remaining battery life due to temporary fluctuation of the deterioration characteristic in the time-series data of the deterioration characteristic. Accordingly, the first aspect of the present disclosure may obtain the prediction model that may improve the prediction precision at when estimating the remaining lifetime of the battery for vehicles.

A second aspect of the present disclosure, in the above first aspect, may further include: a generation section configured to generate plural partial time-series data as the learning data, the plural partial time-series data being generated by: acquiring the time-series data of the deterioration characteristic of the vehicle battery for learning, dividing the acquired time-series data for each predetermined period, and assigning the remaining life of the vehicle battery for learning as a label for each divided partial time-series data.

In the second aspect of the present disclosure, the prediction model is learned in units of individual partial time-series data that is divided for every predetermined period, and the remaining lifetime is given as a label. Due to the above, data with different sequence lengths can be used for learning the same prediction model (for example, the sequence length for one year, or the sequence length for three years may be used for learning the same prediction model). Accordingly, the second aspect of the present disclosure may reduce the calculation load in the prediction model learning and the calculation load in the remaining life prediction using the learned prediction model.

A third aspect of the present disclosure is a battery life prediction device, including: an acquisition section configured to acquire time-series data of a deterioration characteristic of a prediction target vehicle battery; and a prediction section configured to predict a remaining life of the prediction target vehicle battery based on the time-series data of the deterioration characteristic of the prediction target vehicle battery acquired by the acquisition section and based on a learned prediction model that has been learned in advance from learning data, the learning data including time-series data of the deterioration characteristic at a predetermined time point in the past of a vehicle battery for learning that has reached an end of life and the remaining life at the predetermined time point of the vehicle battery for learning.

In the third aspect of the present disclosure, a vehicle battery is predicted using a learned prediction model that has been learned in advance from learning data. The learning data includes time-series data of deterioration characteristics of the vehicle battery for learning that has reached the end of its life. Therefore, even in a case in which the time-series data of the deterioration characteristic of the prediction target vehicle battery includes data indicating temporary fluctuation of the deterioration characteristic, the third aspect of the present disclosure may suppress erroneous prediction that there is no remaining battery life from the temporary change in the deterioration characteristic. Accordingly, the third aspect of the present disclosure may improve the prediction accuracy when predicting the remaining life of the vehicle battery.

In a fourth aspect of the present disclosure, in the third aspect, the prediction section may be configured to stop the prediction of the remaining life of the prediction target vehicle battery in a case in which an appearance frequency of an unmeasured portion in the deterioration characteristic is equal to or greater than a predetermined value or more in the time-series data of the deterioration characteristic of the prediction target vehicle battery.

In the fourth aspect of the present disclosure, in the time-series data of the deterioration characteristic of the prediction target vehicle battery, due to low the vehicle usage frequency, the appearance frequency of the unmeasured portion of the deterioration characteristic may become equal to or greater than a predetermined value. In a case in which it is estimated that the prediction accuracy may be reduced due to inserting the estimated value of the deterioration characteristic into the unmeasured portion, the prediction of the remaining life of the prediction target vehicle battery may be stopped. Accordingly, output of an incorrect prediction of the remaining life of the prediction target vehicle battery may be suppressed.

A fifth aspect of the present disclosure, in the third aspect or the fourth aspect, may further include a display control section configured to cause a display section to display the time-series data of the deterioration characteristic of the prediction target vehicle battery, and to display comments corresponding to the remaining life of the prediction target vehicle battery predicted by the prediction section.

In the fifth aspect of the present disclosure, even in a case in which the user is not accustomed to interpret the time-series data of the deterioration characteristic of the vehicle battery, from the comments displayed on the display section, the user may understand the time-series data of the deterioration characteristic of the vehicle battery.

A sixth aspect of the present disclosure is a battery life learning method executed by a computer, the method including: obtaining learned prediction model for predicting a remaining life of a vehicle battery from time-series data of a deterioration characteristic of the vehicle battery, the learned prediction model being obtained by learning a prediction model from the time-series data of the deterioration characteristic of the vehicle battery based on learning data, the learning data including time-series data of the deterioration characteristic at a predetermined time point in the past of a vehicle battery for learning that has reached an end of life and the remaining life at the predetermined time point of the vehicle battery for learning. Accordingly, similarly to the first aspect of the present disclosure, the prediction model that may improve prediction precision when estimating the remaining lifetime of the battery for the vehicle may be obtained.

A seventh aspect of the present disclosure is a battery life prediction method executed by a computer, the method including: acquiring time-series data of a deterioration characteristic of a prediction target vehicle battery; and predicting a remaining life of the prediction target vehicle battery based on the time-series data of the deterioration characteristic of the prediction target vehicle battery acquired by the acquisition section and based on a learned prediction model that has been learned in advance from learning data, the learning data including time-series data of the deterioration characteristic at a predetermined time point in the past of a vehicle battery for learning that has reached an end of life and the remaining life at the predetermined time point of the vehicle battery for learning. Accordingly, similarly to the third aspect of the present disclosure, the prediction accuracy when estimating the remaining life of the battery for vehicles may be raised.

An eighth aspect of the present disclosure is a non-transitory computer readable medium storing a program causing a computer to execute processing for battery life learning, the processing including: obtaining a learned prediction model for predicting a remaining life of a vehicle battery from time-series data of a deterioration characteristic of the vehicle battery, the learned prediction model obtained by learning a prediction model from the time-series data of the deterioration characteristic of the vehicle battery based on learning data, the learning data including time-series data of the deterioration characteristic at a predetermined time point in the past of a vehicle battery for learning that has reached an end of life and the remaining life at the predetermined time point of the vehicle battery for learning. Accordingly, similarly to the first aspect of the present disclosure, the prediction model that may improve prediction precision when estimating the remaining lifetime of the battery for the vehicle may be obtained.

A ninth aspect of the present disclosure is a non-transitory computer readable medium storing a program causing a computer to execute processing for battery life prediction, the processing including: acquiring time-series data of a deterioration characteristic of a prediction target vehicle battery; and predicting a remaining life of the prediction target vehicle battery based on the time-series data of the deterioration characteristic of the prediction target vehicle battery acquired by the acquisition section and based on a learned prediction model that has been learned in advance from learning data, the learning data including time-series data of the deterioration characteristic at predetermined time point in the past of a vehicle battery for learning that has reached an end of life and the remaining life at the predetermined time point of the vehicle battery for learning. Accordingly, similarly to the third aspect of the present disclosure, the prediction accuracy when estimating the remaining life of the battery for vehicles may be raised.

According to the above aspects, a battery life learning device, a battery life learning method, a non-transitory computer readable medium storing a battery life learning program, a battery life prediction device, a battery life prediction method, and a non-transitory computer readable medium storing a battery life prediction program of the present disclosure may improve the prediction accuracy when predicting the remaining life of the vehicle battery.

BRIEF DESCRIPTION OF THE DRAWINGS

Exemplary embodiments of the present disclosure will be described in detail based on the following figures, wherein:

FIG. 9 is an image diagram illustrating an example of display of comments;

FIG. 10 is an image diagram illustrating an example of display of comments;

DETAILED DESCRIPTION

Figure 1:
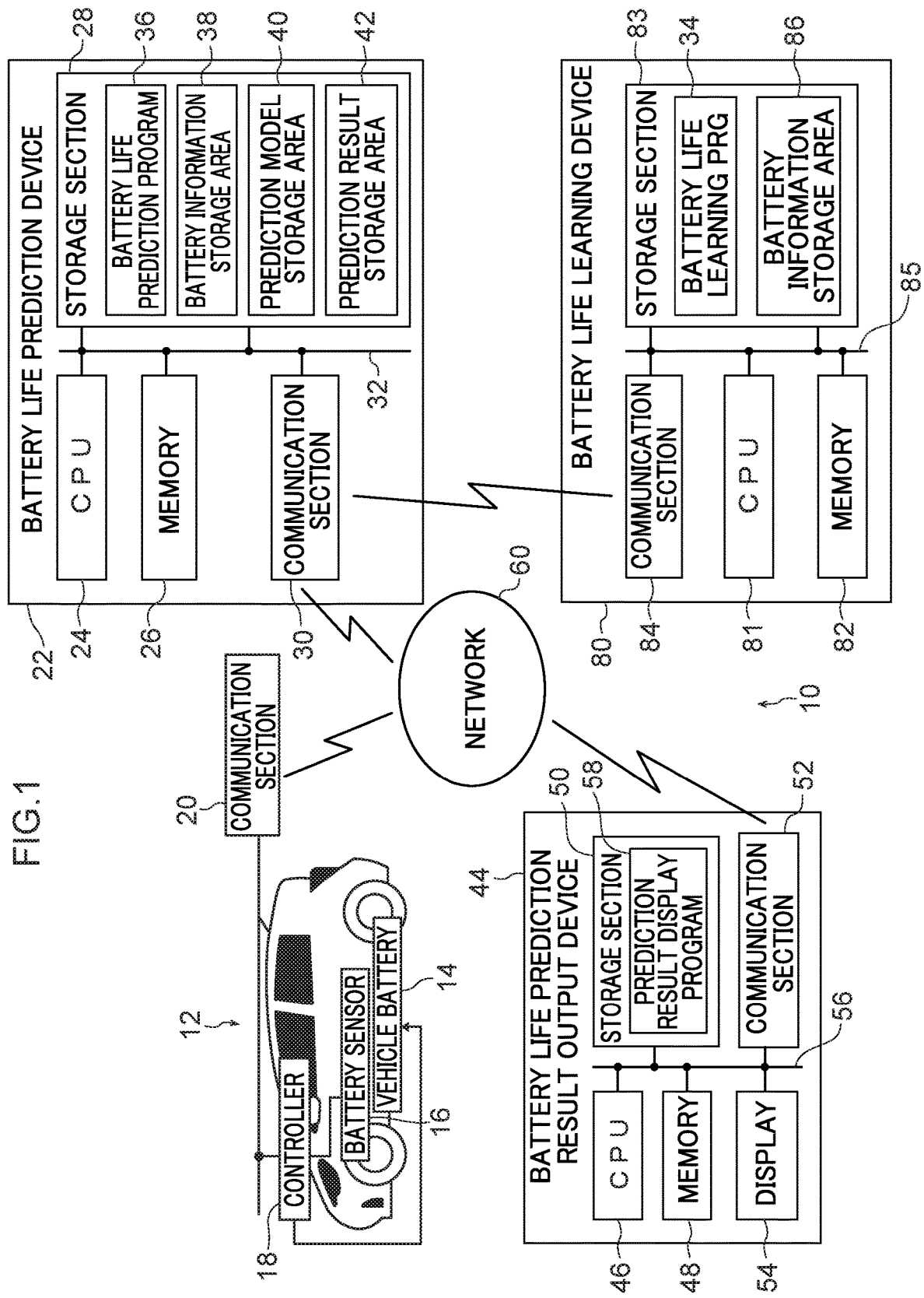
FIG. 1 is a block diagram illustrating a schematic configuration of a delivery system 10 according to the exemplary embodiment.

Hereinafter, an example of an exemplary embodiment of the present disclosure will be described in detail with reference to the drawings. A battery life prediction system 10 illustrated in FIG. 1 includes a charge/discharge system 12 mounted on a vehicle, a battery life learning device 80, a battery life prediction device 22, and a battery life prediction result output device 44 provided at a base that performs vehicle maintenance (for example, a vehicle dealer). The charge/discharge system 12, the battery life prediction device 22, and the battery life prediction result output device 44 are communicably connected via the network 60, and the battery life learning device 80 is communicably connected to the battery life prediction device 22. Although FIG. 1 illustrates only one vehicle on which the charge/discharge system 12 is mounted, the charge/discharge system 12 may be mounted on each of plural vehicles.

Figure 6:
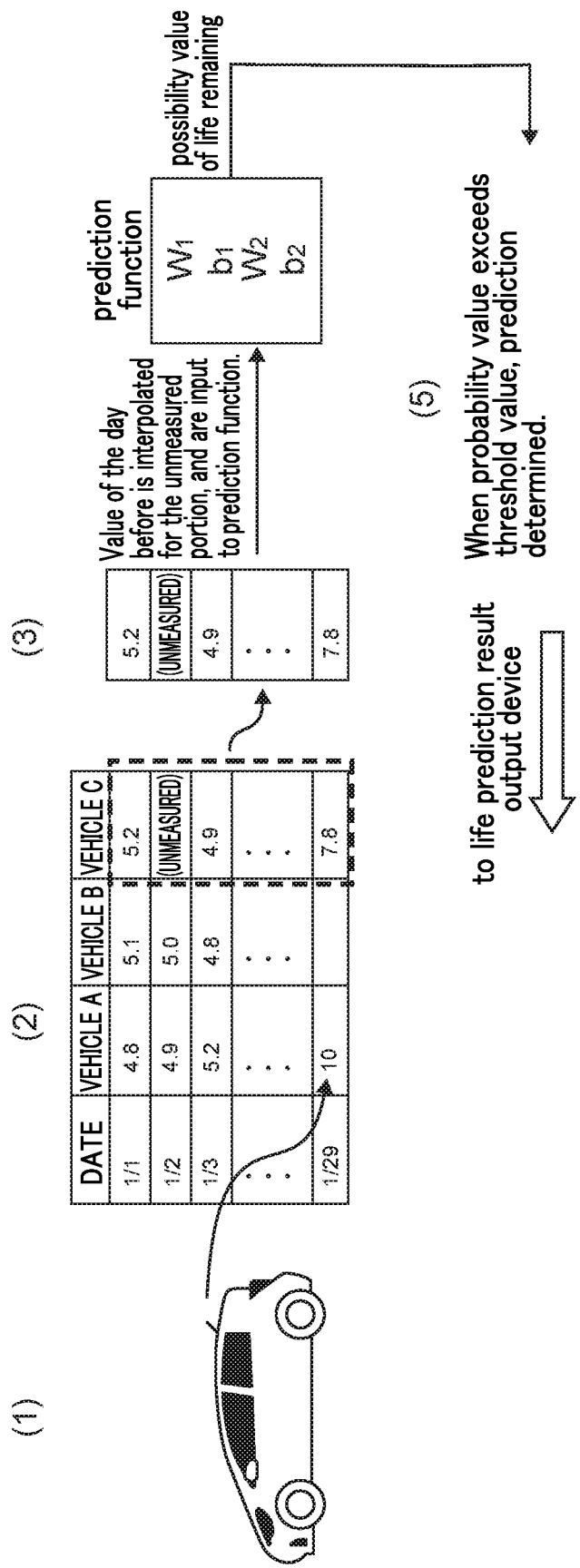
FIG. 6 is an image diagram for explaining the battery life prediction process.

The charge/discharge system 12 includes a vehicle battery 14 used as an auxiliary battery of the vehicle, a battery sensor 16 connected to the vehicle battery 14, a controller 18 that performs power management including management of the vehicle battery 14, and the communication section 20. In the present exemplary embodiment, some of the various parameters representing the battery state, such as internal resistance, voltage, current, temperature, charge amount, full charge capacity, etc. of the vehicle battery 14 are measured by the battery sensor 16 and the rest are measured by the controller 18. Each time the ignition switch of the vehicle is turned ON, the controller 18 collects various parameters representing the battery state as battery information (see also (1) of FIG. 6: Observe deterioration characteristic), and the collected information is transmitted to the battery life prediction device 22 via the communication section 20.

Note that the battery sensor 16 may be omitted, and the controller 18 may be configured to measure all of the various parameters representing the battery state.

The battery life learning device 80 includes a CPU (Central Processing Unit) 81, a memory 82 such as a ROM (Read Only Memory) and a RAM (Random Access Memory), a storage section 83 which is a nonvolatile memory such as HDD (Hard Disk Drive) or SSD (Solid State Drive), and a communication section 84. The CPU 81, the memory 82, the storage section 83, and the communication section 84 are connected via an internal bus 85 so that they can communicate with each other.

The storage section 83 stores a battery life learning program 34, and is provided with a battery information storage area 86. The battery life learning device 80 performs battery life learning process by reading-out the battery life learning program 34 from the storage section 83, expanding the battery life learning program 34 in the memory 82, and executing the battery life learning program 34 by the CPU 81. Accordingly, the battery life learning device 80 functions as an example of the battery life learning device.

The battery life prediction device 22 includes a CPU 24, a memory 26 such as a ROM or a RAM, a non-volatile storage section 28 such as HDD or SSD, and a communication section 30. The CPU 24, the memory 26, the storage section 28, and the communication section 30 are connected via an internal bus 32 so that they can communicate with each other.

The storage section 28 stores a battery life prediction program 36, and includes a battery information storage area 38, a prediction model storage area 40, and a prediction result storage area 42. Each time battery information is received from the charge/discharge system 12, the battery life prediction device 22 distinguishes the received battery information for each vehicle (for each vehicle battery 14) respectively, and stores it in the battery information storage area 38.

The battery life learning device 22 performs battery life learning process by reading-out the battery life prediction program 36 from the storage section 28, expanding the battery life prediction program 36 in the memory 26, and executing the battery life prediction program 36 by the CPU 24. Accordingly, the battery life prediction device 22 functions as an example of a battery life prediction device together with a battery life prediction result output device 44 described below.

The battery life prediction result output device 44 includes a CPU 46, a memory 48 such as ROM or RAM, a non-volatile storage section 50 such as HDD or SSD, a communication section 52, and a display 54. The CPU 46, the memory 48, the storage section 50, the communication section 52, and the display 54 are connected via an internal bus 56 so that they can communicate with each other. The display 54 is an example of a display section.

The storage section 50 stores a prediction result display program 58. The battery life prediction result output device 44 performs prediction result display process by reading-out the prediction result display program 58 from the storage section 50, expanding the prediction result display program 58 in the memory 48, and executing the prediction result display program 58 by the CPU 46, which will be described later.

Note that the battery life learning program 34 is an example of a battery life learning program, and the battery life prediction program 36 and the prediction result display program 58 are examples of a battery life prediction program.

Next, operation of the present exemplary embodiment will be described. The battery life prediction device 22 stores the battery information received from the charge/discharge system 12 in the battery information storage area 38 of the storage section 28 for a long period of several years or more. Therefore, time-series data of battery information is stored in the battery information storage area 38 for each vehicle battery 14, respectively (see also (2) of FIG. 6: Accumulation of deterioration characteristic). Further, in the time-series data of the battery information stored in the battery information storage area 38, battery information time-series data of a vehicle battery 14 that has already been replaced at the end of its life (hereinafter referred to as a vehicle battery 14 for learning) is also included.

Figure 2:
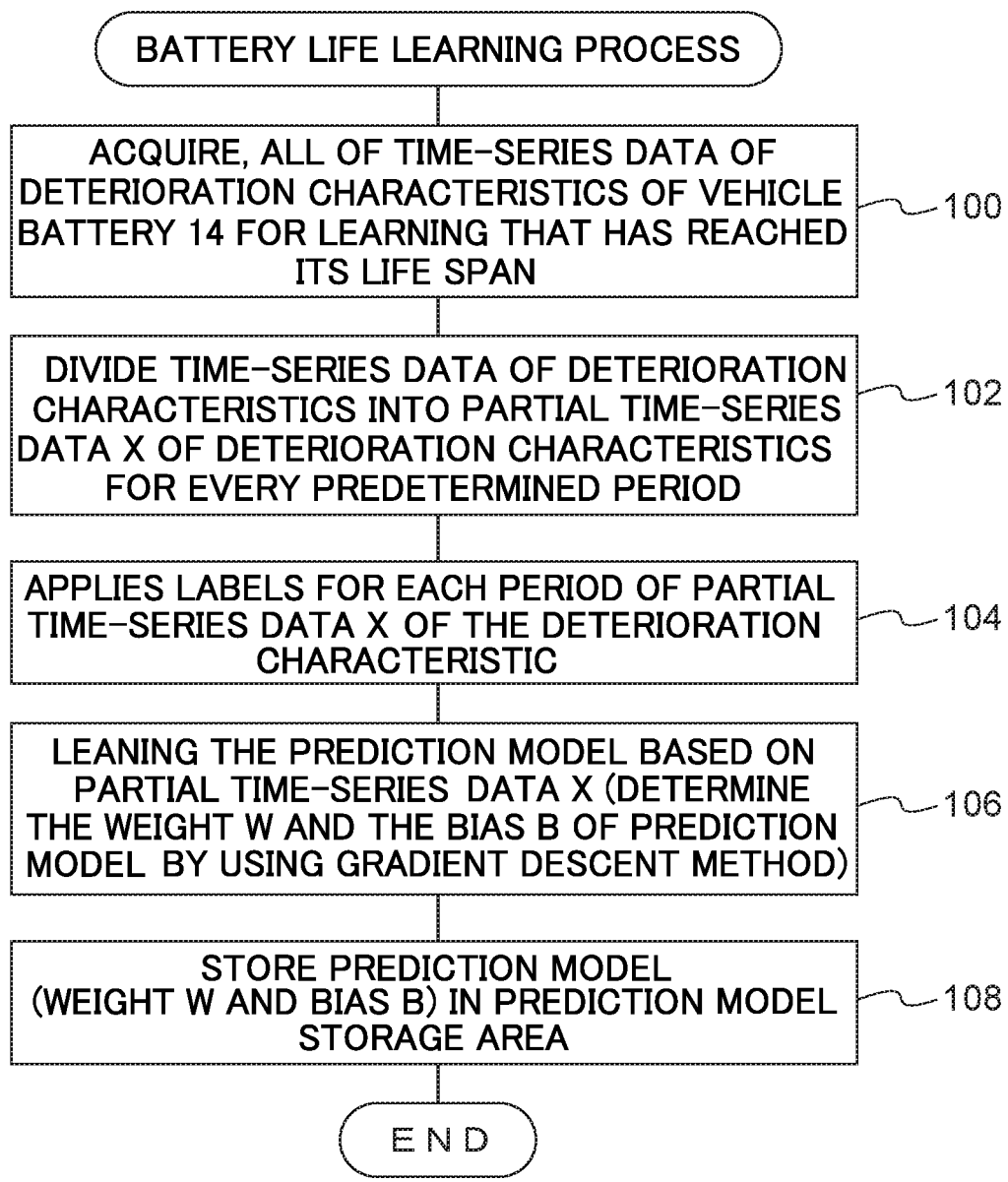
FIG. 2 is a flowchart showing an example of the flow of battery life learning process.

Next, the battery life learning process performed by the battery life learning device 80 will be described with reference to FIG. 2. In step 100, the battery life learning device 80 acquires, from the time-series data of the battery information of the plural vehicle batteries 14 stored in the battery information storage area 38 of the battery life prediction device 22, all of time-series data of the deterioration characteristics (for example, internal resistance) of the vehicle battery 14 for learning that has reached its life span. Next, the acquired time-series data are stored in the battery information storage area 86. Note that the time-series data of the deterioration characteristic acquired here is data for the entire life period from when a new vehicle battery 14 reaches the end of its life.

Figure 3:
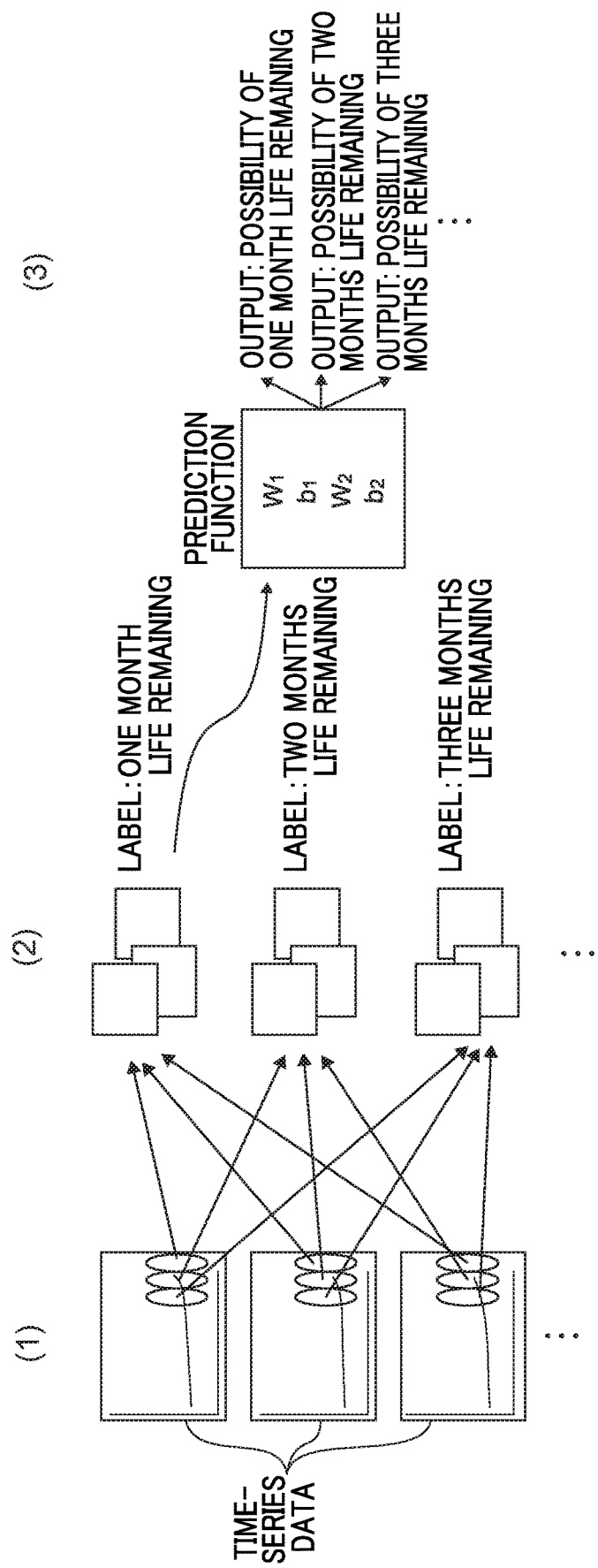
FIG. 3 is an image diagram for explaining the battery life learning process.

In next step 102, the battery life learning device 80 divides the time-series data of the deterioration characteristics acquired in step 100 into partial time-series data x of the deterioration characteristics for every predetermined period (for example, 30 days). (See also (1) of FIG. 3: Obtaining data representing deterioration characteristics from plural vehicles.) Note that the division into time-series data x for each predetermined period may be performed as follows.

Namely, the division into time-series data x is performed by: setting the last date in the time-series data of the deterioration characteristics before the division as the end; dividing and extracting data of a predetermined period starting from the date 29 days before the end as partial time-series data of the deterioration characteristic; and repeating and shifting the last date of the predetermined period by a predetermined number of days (for example, one day). Accordingly, the partial time-series data of plural deterioration characteristics whose extraction periods are shifted by a predetermined number of days are obtained from the time-series data of deterioration characteristics before division.

In step 104, the battery life learning device 80 applies, for each period of the partial time-series data x of the deterioration characteristic, the remaining life of the vehicle battery 14 for learning in a period that has been extracted as the partial time-series data x, as labels. (See also (2) of FIG. 3: Divide into fixed intervals and label data).

For example, in a case in which the partial time-series data x of the deterioration characteristic obtained by dividing and extracting the data for a predetermined period in the vehicle battery 14 for leaning that has one month life remaining, from the time-series data of the deterioration characteristic before the division, a label of "one month life remaining" is applied. Further, for example, in a case in which the partial time-series data x of the deterioration characteristic obtained by dividing and extracting the data for a predetermined period in the vehicle battery 14 for leaning that has three months life remaining, from the time-series data of the deterioration characteristic before the division, a label of "three months life remaining" is applied.

Note that the partial time-series data x of the deterioration characteristic to which the remaining lifetime label is applied is an example of learning data. Further, steps 100 to 104 are an example of process executed by the generation section.

Figure 4:
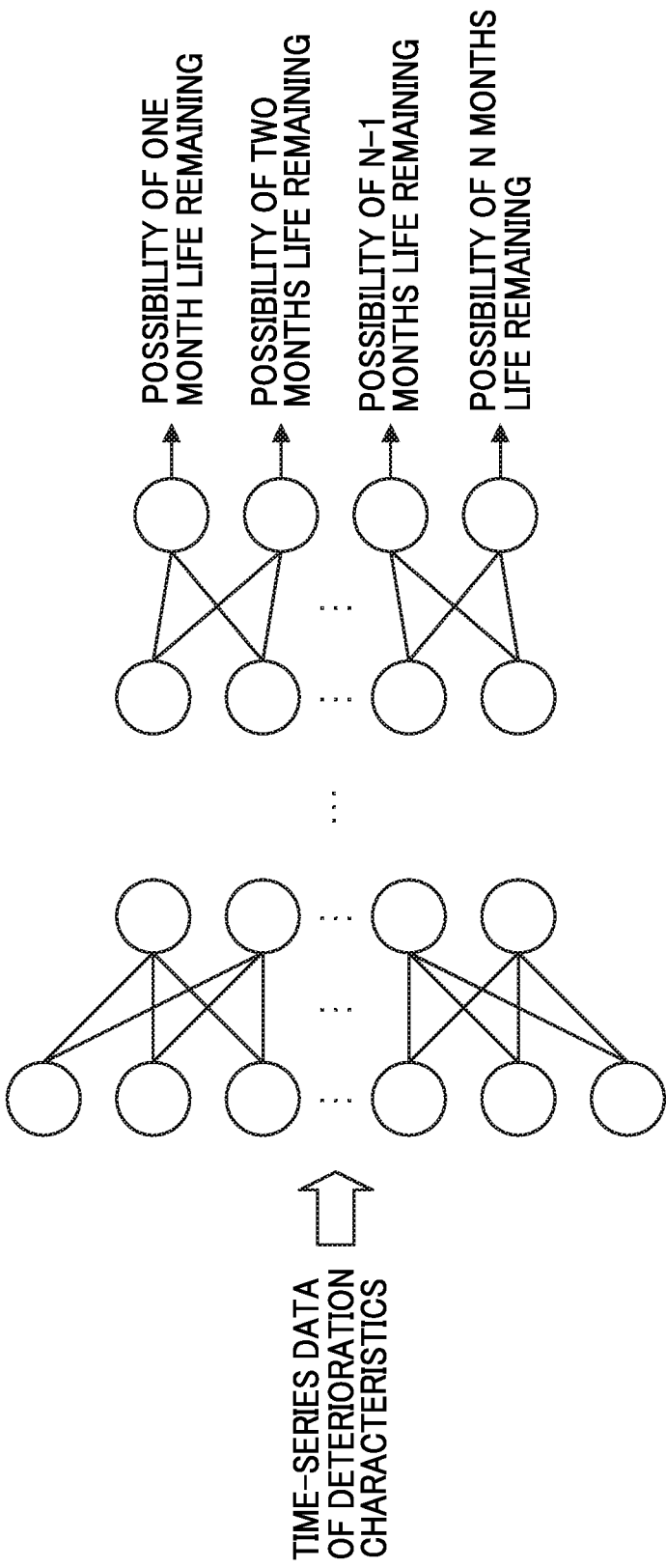
FIG. 4 is a diagram illustrating an example of a prediction model according to the exemplary embodiment.

In step 106, the battery life learning device 80 generates a learned prediction model by learning a prediction model. Here, the prediction model is a model for predicting the remaining life of the vehicle battery 14 from the time-series data of the deterioration characteristic of the vehicle battery 14, based on the partial time-series data x of the deterioration characteristic assigned with the remaining life label (outputting the probability of each remaining life class). In this exemplary embodiment, a neural network as shown in FIG. 4 may be employed as an example of a prediction model, and for example, a gradient descent method may be used for learning.

The prediction of the remaining life of the vehicle battery 14 based on the prediction model can be expressed by the following equations (1) and (2), in a case in which the neural network has three layers.

$$a = f(W1x + b1) \quad (1)$$

$$y = g(W2a + b2) \quad (2)$$

Note that W1 and W2 denote weights, b1 and b2 denote bias values, and y denotes a probability value of the remaining life. Further, various functions such as a sigmoid function, a tan h function, and a ReLU function can be used as the function f ( ). Furthermore, the softmax function can be used as the function g ( ).

In step 106, the weight W and the bias b are determined by the gradient descent method, such that the remaining life of the vehicle battery 14 is output as the probability value y from the time-series data x of the deterioration characteristic of the given vehicle battery 14 for a predetermined period. For example, in a case in which learning using the partial time-series data x of the deterioration characteristic in which a label of "one month life remaining" is applied, the weight W and the bias b are adjusted such that the probability value y of the class of the one month life remaining approaches to 1 and the probability value y of the other classes (classes such as two months life remaining or three months life remaining) approaches to 0. (see also (3) of FIG. 3: Store data and label pair in prediction function)

Note that, step 106 is an example of process by the learning section. Further, the neural network may have four or more layers. Further, a learning algorithm different from the gradient descent method may be used.

In step 108, the battery life learning device 80 transmits the prediction model (weight W and bias b) obtained by the process in step 106 to the battery life prediction device 22, stores the prediction model in the prediction model storage area 40 of the storage section 28 of the battery life prediction device 22, and ends the battery life learning process.

Figure 5:
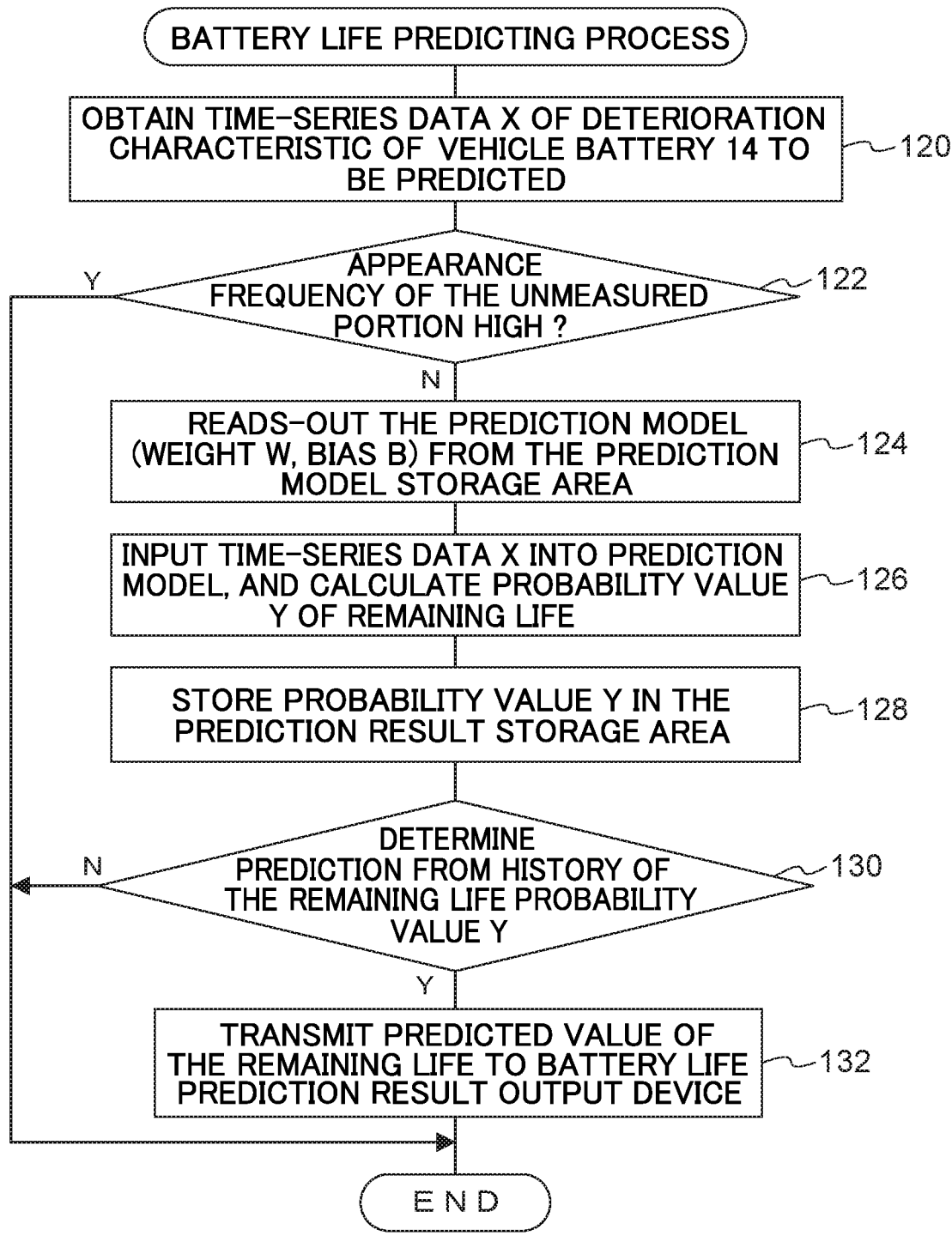
FIG. 5 is a flowchart illustrating an example of a flow of the battery life prediction process.

Next, the battery life predicting process performed by the battery life prediction diction device 22 will be described with reference to FIG. 5. Note that, the battery life prediction process is executed periodically (for example, every day) for each prediction target vehicle battery 14. The prediction target vehicle battery 14 here is a vehicle battery 14 that has not yet reached the end of its life.

In step 120, the battery life prediction device 22 obtains time-series data x of deterioration characteristic of the prediction target vehicle battery 14 for a predetermined period (for example, the latest predetermined period starting from 29 days before the end when the current date is set as the end) from the battery information storage area 38 of the storage section 28. (see also (3) of FIG. 6: Extract data for prediction in period.) Note that, step 120 is an example of process by the obtaining section.

In step 122, the battery life prediction device 22 scans the obtained time-series data x of the deterioration characteristic of the prediction target vehicle battery 14. Further, the battery life prediction device 22, within the predetermined period, counts the days when the deterioration characteristic is not measured (appearance frequency of unmeasured portion) due to the ignition switch of the vehicle not been turned ON. Then, the battery life prediction device 22 determines whether or not the appearance frequency of the unmeasured portion in the time-series data x of the deterioration characteristic is equal to or greater than a predetermined value, by determining whether or not the counted date is equal to or greater than a predetermined value.

In the remaining life prediction of the vehicle battery 14 described later, when an unmeasured portion is included in the time-series data x of the prediction target vehicle battery 14, the estimated value of the deterioration characteristic is inserted into the unmeasured portion. For this reason, for example, it can be presumed that, in a case in which the frequency of use of the vehicle is low, the prediction accuracy of the battery remaining life prediction of the vehicle battery 14 may be reduced, when the appearance frequency of the unmeasured portion in the time-series data x is equal to or greater than a predetermined value. Therefore, in a case in which the determination in step 122 is affirmative, the battery life prediction process is terminated without performing the battery remaining life prediction of the vehicle battery 14.

On the other hand, in a case in which the appearance frequency of the unmeasured portion in the time-series data x of the deterioration characteristic is less than the predetermined value, a negative determination is made in step 122, and the process proceeds to step 124. In step 124, the battery life prediction device 22 reads-out the prediction model (weight W, bias b) from the prediction model storage area 40 of the storage section 28.

In step 126, the battery life prediction device 22 inputs the time-series data x of the deterioration characteristic of the prediction target vehicle battery 14 into the prediction model, and performs signal processing of the multilayer neural network. Accordingly, the probability value y of the remaining life of the prediction target vehicle battery 14 is calculated (see also (4) of FIG. 6: prediction process). Note that, from the prediction model, information indicating that the possibility of remaining life of the vehicle battery 14 is one month is 60% (probability value y=60%), possibility of the remaining life is two months is 30% (probability value y=30%), possibility of the remaining life is three months is 10% (probability value y=10%) is, for example, output. Note that step 126 together with step 122 and step 130 (described later) are examples of processes executed by the prediction section.

In step 128, the battery life prediction device 22 stores the probability value y of the remaining life of the prediction target vehicle battery 14 obtained in step 126 in the prediction result storage area 42 of the storage section 28.

In the next step 130, the battery life prediction device 22 refers to the history of the remaining life probability value y of the prediction object vehicle battery 14 stored in the prediction result storage area 42. Then, the battery life prediction device 22 determines whether or not the remaining life prediction has been determined based on whether or not the probability value y exceeds the threshold value within a certain period (see also (5) of FIG. 6: Determination of prediction). As an example, in a case in which the probability value y in "the remaining life is one month" exceeds the threshold value 0.7 for three consecutive days, it is determined that the prediction that the remaining life is one month has been confirmed.

If a negative determination is made in step 130, the battery life prediction process ends. However, if an affirmative determination is made in step 130, the process proceeds to step 132. In step 132, the battery life prediction device 22 transmits the determined predicted value of the remaining life of the prediction target vehicle battery 14, together with the time-series data of the deterioration characteristic of the prediction target vehicle battery 14 (for example, data of the past six months), to the battery life prediction result output device 44, and the battery life prediction process ends. Note that the predicted value of the remaining life of the prediction target vehicle battery 14 and the time-series data of the deterioration characteristic transmitted from the battery life prediction device 22 are stored in the storage section 50 of the battery life prediction result output device 44.

Figure 7:
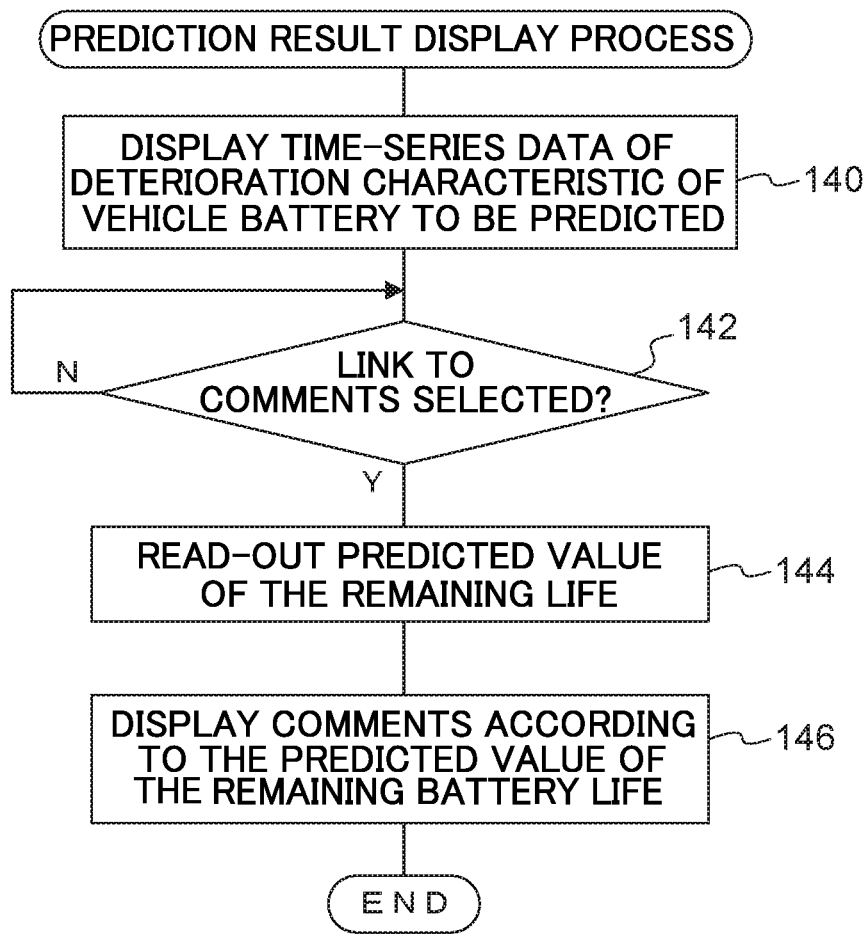
FIG. 7 is a flowchart illustrating an example of a flow of the prediction result display process.

Next, a prediction result display process performed by the battery life prediction result output device 44 will be described with reference to FIG. 7. This prediction result display process is executed when a dealer employee (user of the battery life prediction result output device 44) inputs an instruction to output information related to a specific vehicle (a vehicle on which the prediction target vehicle battery 14 is mounted) to the battery life prediction result output device 44. The prediction result display process is an example of a process performed by the display control section.

Figure 8:
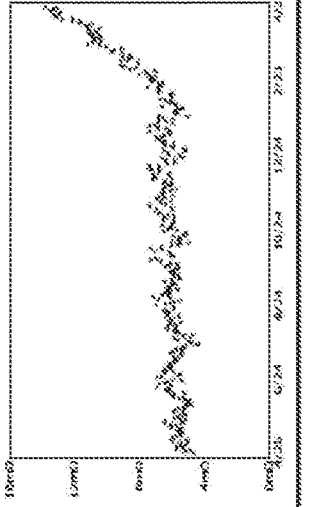
FIG. 8 is an image diagram illustrating an example of display of a time-series data.
Figure 11:
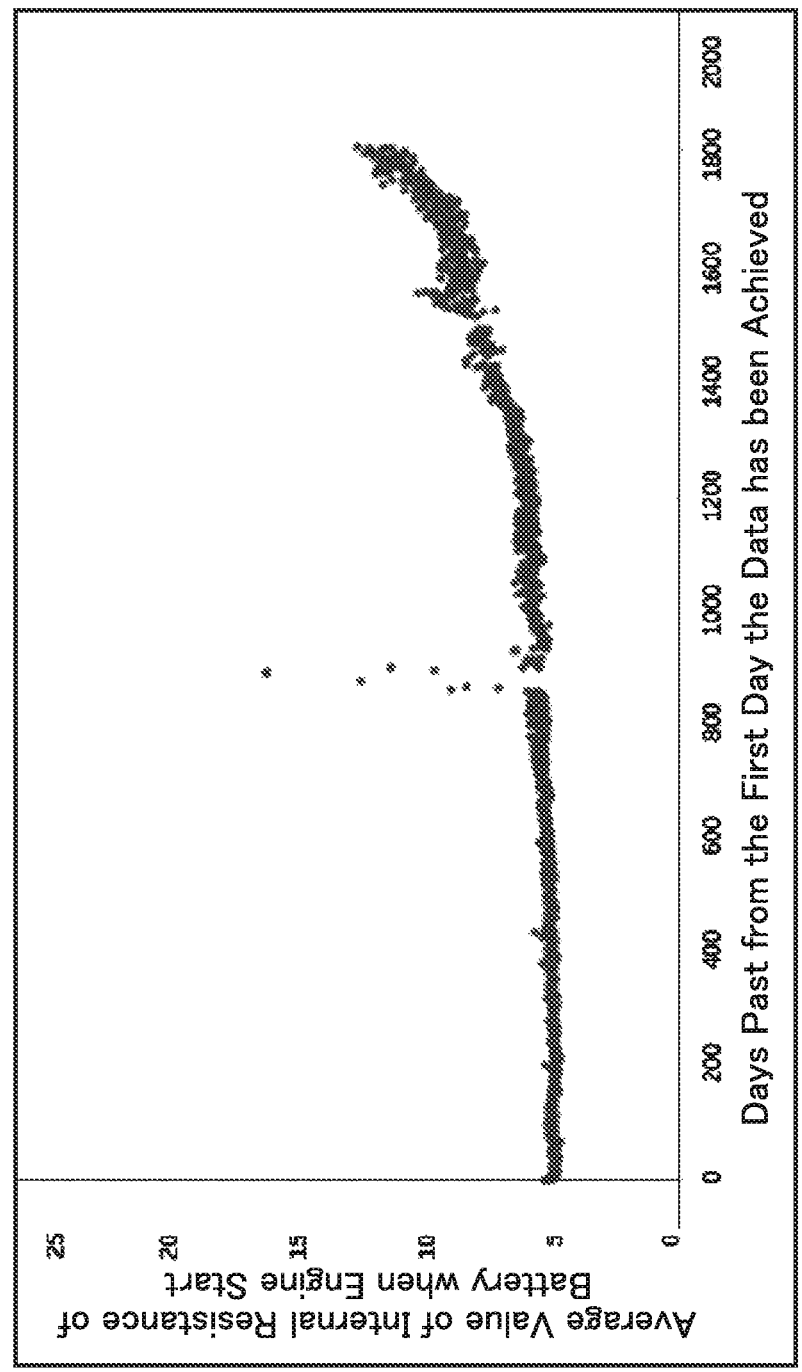
FIG. 11 is a diagram illustrating a case in which the deterioration characteristic of the vehicle battery changes greatly temporarily.

In step 140, the battery life prediction result output device 44 displays on the display 54, as shown in FIG. 8 as an example, information related to a specific vehicle, together with a time-series data display screen 70 to which a window 72 that displays the time-series data of the deterioration characteristic of the prediction target vehicle battery 14 is applied.

In the window 72, a link 74 (button labeled "Guide") to the comments is displayed. In the next step 142, the battery life prediction result output device 44 determines whether or not the link 74 to the comments has been selected. If a negative determination is made in step 142, step 142 is repeated until an affirmative determination is made. When the link 74 to the comments is selected, an affirmative determination is made in step 142 and the process proceeds to step 144.

In step 144, the battery life prediction result output device 44 reads-out from the storage section 50 a predicted value of the remaining life of the prediction target vehicle battery 14 mounted on a specific vehicle. Then, in step 146, the battery life prediction result output device 44 causes the display 54 to display a comment display screen 76 on which comments according to the predicted value of the remaining battery life read from the storage section 50 are indicated.

Specifically, in a case in which the predicted value of the remaining life of the prediction target vehicle battery 14 mounted on a specific vehicle is within one month, a comments display screen 76A shown in FIG. 9 is displayed on display 54. The comments display screen 76A displays comments together with legend for each case including a case in which the vehicle battery 14 is deteriorated and a case in which an erroneous determination has been made due to an abnormal value is included in the deterioration characteristic of the vehicle battery 14. Accordingly, the dealer employee may be assisted to determine whether the life prediction result for the prediction target vehicle battery 14 is an appropriate determination or an erroneous determination, and can appropriately notify an owner of the prediction target vehicle battery 14 (owner of the specific vehicle).

Further, for example, in a case in which the predicted value of the remaining life of the prediction target vehicle battery 14 mounted on a specific vehicle is over one month, comments display screen 76B shown in FIG. 10 is displayed on display 54. Further, in the comments display screen 76B, comments for each cases including a case in which the vehicle battery 14 is used in a standard manner and a case in which the vehicle battery 14 is used less frequently, are displayed. Accordingly, the dealer employee may give an advice to the owner (owner of the specific vehicle) according to the use condition of the vehicle battery 14.

As described above, the present embodiment uses data for learning that includes the time-series data of deterioration characteristic at predetermined time point of the vehicle battery 14 for learning that has reached the end of life and the remaining life at predetermined time point of the vehicle battery 14 for learning. Based on the learning data, a prediction model for predicting the remaining life of the vehicle battery 14 is learned from the time-series data of the deterioration characteristic of the vehicle battery 14. Further, remaining life of the vehicle battery 14 of the vehicle is determined from the time-series data of the deterioration characteristic. Thus, a trained prediction model for predicting the remaining battery life is obtained. Accordingly, the prediction model that may improve prediction precision when estimating the remaining lifetime of the battery for the vehicle may be obtained.

Further, in the present embodiment, the time-series data of the deterioration characteristic of the vehicle battery 14 for learning is acquired, the time-series data of the acquired deterioration characteristic is divided for every predetermined period, and each of the divided partial time-series data is leveled by giving the remaining life of the vehicle battery 14 for learning as a label, and plural partial time-series data are generated as the learning data. Thereby, data with different sequence lengths can be used for learning the same prediction model (for example, the sequence length for one year, or the sequence length for three years can be used for learning the same prediction model). Accordingly, the calculation load in the prediction model learning and the remaining life prediction using the learned prediction model may be reduced.

Further, in the present embodiment, the remaining life of the prediction target vehicle battery 14 is predicted based on the acquired time-series data of the deterioration characteristic of the prediction target vehicle battery 14, and a learned prediction model. Further, the learned prediction model is previously learned from learning data including time-series data of deterioration characteristics at a predetermined point in time of the vehicle battery 14 that has reached the end of its life and remaining life at a predetermined point in time of the vehicle battery 14 for learning. Accordingly, the prediction accuracy when estimating the remaining life of the battery for vehicles may be raised.

In the present embodiment, in the acquired time-series data of the deterioration characteristic of the prediction target vehicle battery 14, in a case in which the appearance frequency of the unmeasured portion of the deterioration characteristic is equal to or greater than a predetermined value, the prediction of the remaining life is stopped. Accordingly, an erroneous prediction of the remaining life of the vehicle battery 14 may be suppressed from being outputted.

In the present embodiment, the display 54 displays time-series data of the deterioration characteristic of the prediction target vehicle battery 14, and also displays comments according to the predicted remaining life of the prediction target vehicle battery 14. As a result, even if the user (the dealer employee) is unfamiliar with interpreting the time-series data of the deterioration characteristic of the vehicle battery, the user may understand the meaning of the time-series data of the deterioration characteristic of the vehicle battery from the comments displayed on the display section.

In addition, although internal resistance was mentioned as an example of the deterioration characteristic of the vehicles battery 14, other parameters, such as a full charge capacity may be use as the deterioration characteristic.

Moreover, in the above, a case in which an auxiliary battery is applied as the vehicle battery 14, has been described. However, the present disclosure it is not limited thereto. A main battery in a hybrid vehicle (HV) or in an electric vehicle (EV) may be applied as a vehicle battery 14.

Further, in the above, a case in which the prediction result output process (FIG. 7) is performed by the battery life prediction result output device 44, has been described. However, the present disclosure it is not limited thereto. The prediction result output process may be performed in the vehicle, and a display in a vehicle interior may display the life prediction result.

Further, in the above, a case in which the battery life prediction process (FIG. 5) is performed by the battery life prediction device 22, has been described. However, the present disclosure is not limited thereto. The battery life prediction process may be performed by the vehicle.

Further, in the above, a case in which a neural network is used as an example of the prediction model, has been described. However, CNN (Convolutional Neural Network), a decision tree, etc. may be used as the prediction model.

Further, in the above description, a case in which the battery life learning device 80 that generates the prediction model and the battery life prediction device 22 that performs the life prediction of the vehicle battery 14 are provided differently, has been described. However, the present disclosure is not limited thereto. The device that generates the prediction model and the device that performs the life prediction of the vehicle battery 14 may be integrated.

Furthermore, in the above description, a case in which the battery life learning program 34, the battery life prediction program 36, and the prediction result display program 58 have been stored (installed) in the storage sections 28 and 50 in advance, has been described. However, these programs may be provided by recording media, such as a DVD-ROM and a micro SD card, or the like.

What is claimed is:

1. A battery life learning device, comprising:
a learning section configured to obtain a learned prediction model for predicting a remaining life of a vehicle battery from time-series data of a deterioration characteristic of the vehicle battery, the learned prediction model being obtained by learning a prediction model from the time-series data of the deterioration characteristic of the vehicle battery based on learning data, the learning data including time-series data of the deterioration characteristic at a predetermined time point in the past of a vehicle battery for learning that has reached an end of life and a remaining life at the predetermined time point of the vehicle battery for learning.

2. The battery life learning device of claim 1, further comprising a generation section configured to generate a plurality of partial time-series data as the learning data, the plurality of partial time-series data being generated by:
acquiring the time-series data of the deterioration characteristic of the vehicle battery for learning,
dividing the acquired time-series data for each predetermined period, and
assigning the remaining life of the vehicle battery for learning as a label for each divided partial time-series data.

3. The battery life learning device of claim 1, wherein the learned prediction model includes a probabilistic remaining life determination based on a weight value and a bias value.

4. A battery life prediction device, comprising:
an acquisition section configured to acquire time-series data of a deterioration characteristic of a prediction target vehicle battery; and
a prediction section configured to predict a remaining life of the prediction target vehicle battery based on the time-series data of the deterioration characteristic of the prediction target vehicle battery acquired by the acquisition section and based on a learned prediction model that has been learned in advance from learning data, the learning data including time-series data of the deterioration characteristic at a predetermined time point in the past of a vehicle battery for learning that has reached an end of life and a remaining life at the predetermined time point of the vehicle battery for learning.

5. The battery life prediction device of claim 4, wherein the prediction section is configured to stop the prediction of the remaining life of the prediction target vehicle battery in a case in which an appearance frequency of an unmeasured portion in the deterioration characteristic is equal to or greater than a predetermined value or more in the time-series data of the deterioration characteristic of the prediction target vehicle battery.

6. The battery life prediction device of claim 4, further comprising a display control section configured to cause a display section to display the time-series data of the deterioration characteristic of the prediction target vehicle battery, and to display comments corresponding to the remaining life of the prediction target vehicle battery predicted by the prediction section.

7. The battery life prediction device of claim 4, wherein the learned prediction model includes a probabilistic remaining life determination based on a weight value and a bias value.

8. A battery life learning method executed by a computer, the method comprising:
obtaining learned prediction model for predicting a remaining life of a vehicle battery from time-series data of a deterioration characteristic of the vehicle battery, the learned prediction model being obtained by learning a prediction model from the time-series data of the deterioration characteristic of the vehicle battery based on learning data, the learning data including time-series data of the deterioration characteristic at a predetermined time point in the past of a vehicle battery for learning that has reached an end of life and a remaining life at the predetermined time point of the vehicle battery for learning.

9. The battery life learning method of claim 8, wherein the learned prediction model includes a probabilistic remaining life determination based on a weight value and a bias value.

10. A battery life prediction method executed by a computer, the method comprising:
acquiring time-series data of a deterioration characteristic of a prediction target vehicle battery; and
predicting a remaining life of the prediction target vehicle battery based on the time-series data of the deterioration characteristic of the prediction target vehicle battery acquired by the acquisition section and based on a learned prediction model that has been learned in advance from learning data, the learning data including time-series data of the deterioration characteristic at a predetermined time point in the past of a vehicle battery for learning that has reached an end of life and a remaining life at the predetermined time point of the vehicle battery for learning.

11. The battery life prediction method of claim 10, wherein the learned prediction model includes a probabilistic remaining life determination based on a weight value and a bias value.

12. A non-transitory computer readable medium storing a program causing a computer to execute processing for battery life learning, the processing comprising:
obtaining a learned prediction model for predicting a remaining life of a vehicle battery from time-series data of a deterioration characteristic of the vehicle battery, the learned prediction model obtained by learning a prediction model from the time-series data of the deterioration characteristic of the vehicle battery based on learning data, the learning data including time-series data of the deterioration characteristic at a predetermined time point in the past of a vehicle battery for learning that has reached an end of life and a remaining life at the predetermined time point of the vehicle battery for learning.

13. The non-transitory computer readable medium of claim 12, wherein the learned prediction model includes a probabilistic remaining life determination based on a weight value and a bias value.

14. A non-transitory computer readable medium storing a program causing a computer to execute processing for battery life prediction, the processing comprising:
acquiring time-series data of a deterioration characteristic of a prediction target vehicle battery; and
predicting a remaining life of the prediction target vehicle battery based on the time-series data of the deterioration characteristic of the prediction target vehicle battery acquired by the acquisition section and based on a learned prediction model that has been learned in advance from learning data, the learning data including time-series data of the deterioration characteristic at a predetermined time point in the past of a vehicle battery for learning that has reached an end of life and a remaining life at the predetermined time point of the vehicle battery for learning.

15. The non-transitory computer readable medium of claim 14, wherein the learned prediction model includes a probabilistic remaining life determination based on a weight value and a bias value.

* * * * *